United States Patent
Kalva et al.

(10) Patent No.: US 10,902,933 B2
(45) Date of Patent: Jan. 26, 2021

(54) TEST SYSTEM FOR EXECUTING BUILT-IN SELF-TEST IN DEPLOYMENT FOR AUTOMOTIVE APPLICATIONS

(71) Applicant: NVIDIA Corporation, San Jose, CA (US)

(72) Inventors: Anitha Kalva, San Jose, CA (US); Jue Wu, Los Gatos, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 16/557,615

(22) Filed: Aug. 30, 2019

(65) Prior Publication Data

US 2020/0075116 A1  Mar. 5, 2020

Related U.S. Application Data

(60) Provisional application No. 62/726,025, filed on Aug. 31, 2018.

(51) Int. Cl.
| | |
|---|---|
| *G11C 29/00* | (2006.01) |
| *G11C 29/32* | (2006.01) |
| *G06F 9/30* | (2018.01) |
| *G11C 29/16* | (2006.01) |

(52) U.S. Cl.
CPC .......... *G11C 29/32* (2013.01); *G06F 9/30101* (2013.01); *G06F 9/30134* (2013.01); *G11C 29/16* (2013.01)

(58) Field of Classification Search
CPC ..... G11C 29/32; G11C 29/16; G06F 9/30134; G06F 9/30101
See application file for complete search history.

(56) References Cited

U.S. PATENT DOCUMENTS

| | | | |
|---|---|---|---|
| 6,715,105 B1 * | 3/2004 | Rearick | G01R 31/318547 714/30 |
| 2008/0104466 A1 | 5/2008 | Menon et al. | |
| 2010/0088563 A1 | 4/2010 | Greb | |

(Continued)

FOREIGN PATENT DOCUMENTS

EP    2749894 A1    7/2014

OTHER PUBLICATIONS

Documentation for JTAG Switcher, Aug. 2018, 17 pages.
(Continued)

*Primary Examiner* — Samir W Rizk
(74) *Attorney, Agent, or Firm* — Shook, Hardy & Bacon L.L.P.

(57) ABSTRACT

In various examples, a test system is provided for executing built-in-self-test (BIST) according to JTAG and IEEE 1500 on chips deployed in-field. Hardware and software selectively connect onto the IEEE 1500 serial interface for running BIST while the chip is being used in deployment—such as in an autonomous vehicle. In addition to providing a mechanism to connect onto the serial interface, the hardware and software may reduce memory requirements and runtime associated with running the test sequences, thereby making BIST possible in deployment. Furthermore, some embodiments include components configured to store functional states of clocks, power, and input/output prior to running BIST, which permits restoration of the functional states after the BIST.

22 Claims, 6 Drawing Sheets

(56) References Cited

U.S. PATENT DOCUMENTS

| | | |
|---|---|---|
| 2011/0258499 A1 | 10/2011 | Casarsa |
| 2013/0318414 A1 | 11/2013 | Sinanoglu |
| 2018/0067163 A1 | 3/2018 | Pagani |
| 2018/0231609 A1* | 8/2018 | Jain .................. G01R 31/31921 |
| 2019/0128963 A1 | 5/2019 | Wu et al. |

OTHER PUBLICATIONS

International Search Report and Written Opinion in International Application No. PCT/US2019/049175 dated May 4, 2020.
International Search Report and Written Opinion dated Feb. 5, 2020 in International Patent Application No. PCT/US2019/049175.

* cited by examiner

TEST SYSTEM FOR EXECUTING BUILT-IN SELF-TEST IN DEPLOYMENT FOR AUTOMOTIVE APPLICATIONS

CROSS-REFERENCE TO RELATED APPLICATIONS

This application is a non-provisional application of U.S. Provisional Patent Application No. 62/726,025, which was filed on Aug. 31, 2018, and is incorporated by reference herein in its entirety.

BACKGROUND

Computing chips are typically tested by manufacturers prior to deployment to verify whether the chips are functioning properly and whether there are any manufacturing defects. For example, the chips may be tested prior to deployment by using Automated Test Equipment (ATE). However, some chips acquire faults after being deployed due to various factors (e.g., environmental hazards, aging, etc.), and in many chip applications it is important to have in-field, fault-detection capabilities. For example, identifying latent faults on a chip after the chip has been deployed in the field is necessary to comply with some industry requirements, such as the ISO26262 ASIL-C requirement for automotive components (e.g., a chip supporting an automotive platform). In some instances, these chips may include a chip architecture configured according to both the Joint Test Action Group (JTAG) Standard and the Institute of Electrical and Electronics Engineers (IEEE) 1500 Standard for Embedded Core Test (IEEE 1500 SECT or simply IEEE 1500). For example, these chips may be organized into IEEE 1500 clusters, and each cluster may include partitions. Each partition may include JTAG registers that are daisy chained in a serial manner throughout the partition, and at a higher level, throughout the chip.

While conventional systems integrate JTAG with IEEE 1500, these systems do not support built-in self-test (BIST) capabilities, or they require large storage, unwieldy runtimes, or both, which make BIST less effective in real-time deployment scenarios. For example, in some conventional systems, relying on ATE to timely identify latent faults (e.g., faults occurring after the chip is deployed in the field for automotive platforms) is not effective, since it would require either users to have ATE or the chip to be taken out of use to a facility having the chip-specific tester. Other conventional systems may be executed using BIST, or a combination of BIST and ATE; however, these systems require large storage and execute relatively slowly. That is, a single JTAG chain test sequence can be thousands of bits, and many JTAG registers must be programmed for running tests. As such, the test sequence is very large, requiring large storage in return. In addition, the JTAG registers are on a relatively slow clock (e.g., one bit accessed per cycle), which results in a long runtime when the test sequence is large—thereby removing the chip from operation in deployment for a period of time that is detrimental to the system.

These conventional systems suffer from other drawbacks, in addition to those described above. For instance, BIST is executed in a system where clocks, power, and I/O states are already configured; however these valid functional states may become corrupted during the logic built-in self-test (LBIST) scan operation, which can affect operations separate from the BIST. In other operations, the existing controls for the JTAG/IEEE 1500 interface do not permit some states of a state machine to be skipped, even when the states are not necessary for a given operation—thereby resulting in unnecessary cycles. Further still, in some conventional systems, multiple JTAG registers may be configured with the same JTAG test sequence, in which case multiple copies of that same JTAG test sequence are stored resulting in larger memory requirements solely for storing copies of the same sequence.

SUMMARY

Embodiments of the present disclosure relate to a test system for executing in-field BIST on a chip configured according to JTAG and IEEE 1500. For example, the chip may be integrated into a system subject to functional-safety standards (e.g., a chip supporting an automotive platform subject to ISO26262 ASIL-C), and the test system may be used to identify latent faults in the chip after deployment. In contrast to conventional systems, such as those described above, the current disclosure describes hardware and software implementations that can be deployed to the chip to selectively connect to the IEEE 1500 serial interface for running BIST while the chip is deployed in the field—such as in an autonomous machine application. In addition to providing a mechanism to connect to the serial interface, deployed hardware and software implementations may reduce memory requirements and runtime associated with running the test sequences, thereby making BIST possible while in the field. Furthermore, some embodiments of the current disclosure include components configured to store functional states of clocks, power, and I/O prior to running BIST, which permits restoration of the functional states after the BIST while reducing a likelihood of corruption during BIST. Other embodiments of the present disclosure may permit states of a finite state machine to be programmatically skipped to avoid executing unnecessary cycles. Further still, a broadcast mode may be used in some embodiments, which enables a single instance of a JTAG test sequence to be communicated in parallel to multiple partitions or clusters, such that memory requirements are reduced by storing only a single copy of the JTAG test sequence.

BRIEF DESCRIPTION OF THE DRAWINGS

The present systems and methods for a test system for executing in-field BIST are described in detail below with reference to the attached drawing figures, which are incorporated herein by reference.

DETAILED DESCRIPTION

Figure 1:
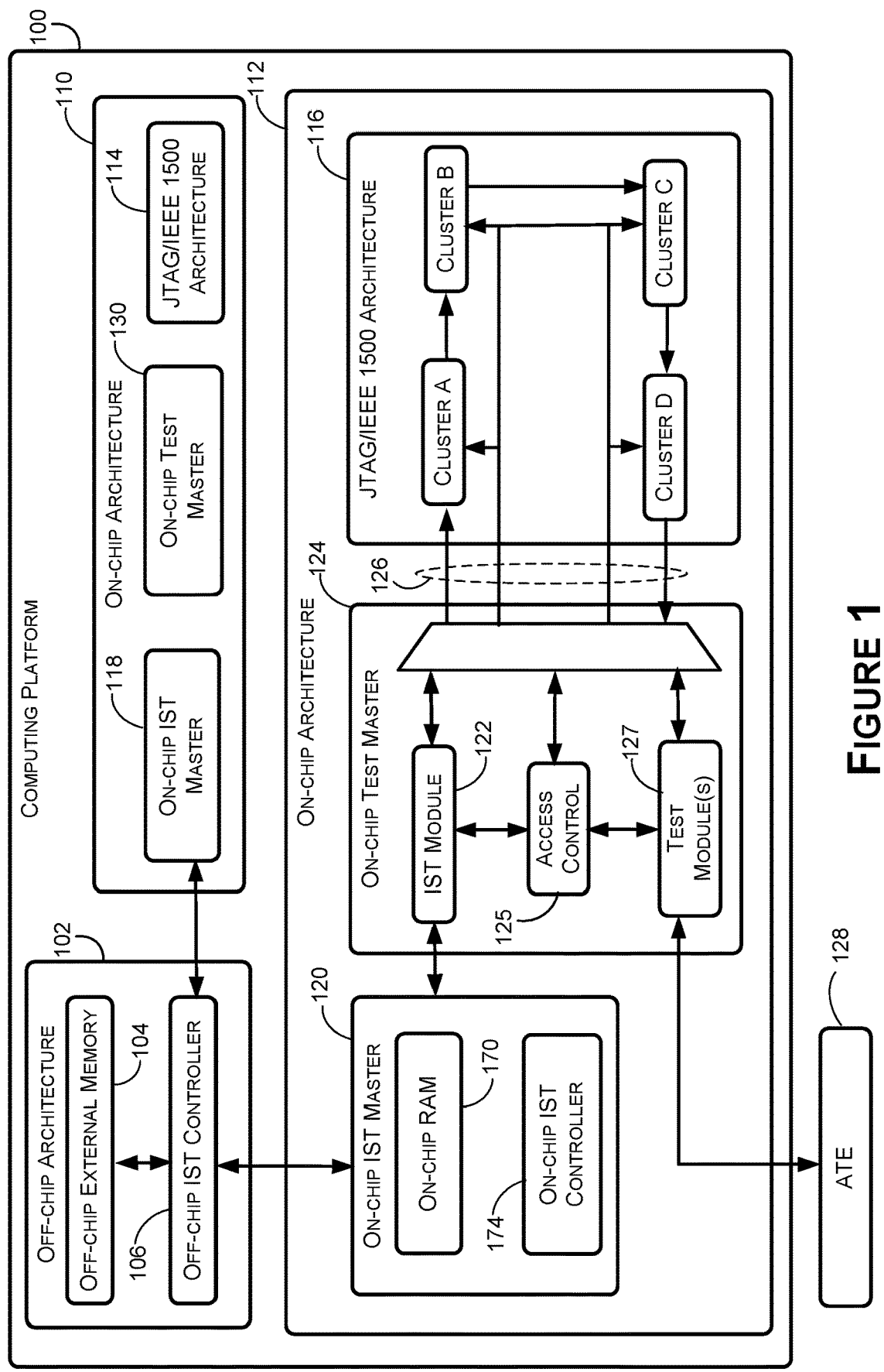
FIG. 1 is a block diagram of a computing environment, including a computing platform and automotive test equipment (ATE), in accordance with some embodiments of the present disclosure.

Systems and methods are disclosed related to a test system for executing in-field BIST on a chip configured according to the Joint Test Action Group (JTAG) standard and the Institute of Electrical and Electronics Engineers (IEEE) 1500 standard. In some instances, the chip may be a component of a larger computing platform used in automotive applications (e.g., autonomous machine applications), or other systems subject to functional-safety standards, and the test system may be configured for in-deployment identification of latent faults in the chip. In contrast to conventional systems, such as those described above, the current disclosure describes hardware and software added to the chip to selectively connect onto the IEEE 1500 serial interface for running BIST while the chip is deployed in the field. In addition to providing a mechanism to connect onto the serial interface, the hardware and software may reduce memory requirements and runtime associated with running the test sequences, thereby making BIST possible while in the field. Furthermore, some embodiments of the current disclosure include components configured to store functional states of clocks, power, and I/O prior to running BIST, which permits restoration of the functional states after the BIST. Although primarily described with respect to JTAG and IEEE 1500, this is not intended to be limiting, and the system and processes herein may be applicable to any testing types, configurations, or standards (e.g., combined with JTAG and IEEE 1500 or used in place of JTAG and IEEE 1500) without departing from scope of present disclosure.

The system of the present disclosure stores chip-specific JTAG test sequences directly in system memory accessible by components on the chip (e.g., flash memory, embedded Multi-Media Controller (eMMC) memory, off-chip system memory, or external system memory), and these chip-specific JTAG test sequences may be used to run memory BIST (MBIST), logic BIST (LBIST), and/or other BIST types for identifying latent faults. The present disclosure also includes on-chip hardware and software that access the JTAG test sequences stored in the system memory and that connect to a JTAG/IEEE 1500 serial interface. This is in contrast to some conventional systems that store the chip-specific JTAG test sequences externally and apart from the integrated system, such as on Automotive Test Equipment (ATE), or that do not have components for connecting to the JTAG/IEEE 1500 interface to run BIST without ATE. Furthermore, in contrast to conventional systems that may store JTAG test sequences in external system memory, the present disclosure includes additional hardware and software implementations that reduce storage utilization in addition to runtime.

The off-chip system components, in combination with the on-chip hardware and software of the present disclosure, may operate in various manners. For example, the present disclosure may include off-chip secured software that accesses the JTAG test sequence from the off-chip system memory and that transmits the JTAG test sequence to the on-chip components—which may then load the JTAG test sequence into the JTAG/IEEE 1500 serial interface. The on-chip components of the present disclosure may include any number of hardware components (e.g., finite state machine, registers, etc.) that may receive the JTAG test sequence prior to translation into the JTAG/IEEE 1500 interface, connect to the JTAG/IEEE 1500 serial interface, and read the test output from the JTAG/IEEE 1500 interface.

As indicated herein, the JTAG chain shift register can be very long, in the range of hundreds to several thousand bits, and JTAG chain shift registers are on a relatively slow clock at one bit accessed per cycle. In addition, because of the serial nature of the interface, every time a JTAG chain shift register is shifted in or out, the whole chain must be accessed to avoid corrupting the chain. This is true even when a particular BIST includes writing a new value to only a single bit in the JTAG chain shift register. As such, and in contrast to conventional systems, when a particular BIST is configured, the system of the present disclosure may configure only the bits that need to be overwritten for a particular BIST, and the rest of the bits in the JTAG chain shift register may be retained (or rewritten) at a predefined reset value. Furthermore, the components of the present disclosure provide the ability to program at the per-bit level. This selective storage of only target bits that need to be written in order to execute a given BIST—as opposed to storing the entire JTAG chain—results in memory-storage savings and faster runtime than conventional approaches.

The present disclosure includes other features that contribute to improved BIST capabilities. For example, as mentioned above, conventional systems do not capture the functional values of clocks, power, and I/O states. In contrast, prior to running LBIST, the system of the present disclosure captures and holds the functional settings—e.g., for configuring clocks, power, and I/O, etc., to avoid corrupting these states during LBIST scan operations. More specifically, the present disclosure includes software that programs JTAG registers to capture the functional settings prior to running the LBIST scan operation and, in further contrast to conventional test systems, the functional settings can be read after LBIST.

Furthermore, in some BIST operations, a same BIST test sequence may be input to multiple JTAG registers (e.g., where multiple partitions or clusters include a same configuration). Conventional systems often store multiple copies of the same BIST test sequence and provide an individual copy to each JTAG register. In contrast, embodiments of the present disclosure include hardware at the partition level and at the cluster level that permit broadcasting a BIST test sequence such that the BIST test sequences may only have to be stored once and loaded once. In addition, using this approach, the BIST test sequence may be sent in parallel to multiple partitions or clusters—thereby decreasing run-time because fewer cycles are used to write the data and further decreasing memory requirements because only a single copy of the JTAG test sequence may need to be stored.

In addition, the JTAG/IEEE 1500 architecture may include power-gated portions along the daisy chain that may prevent access to the chain by breaking the scan path. As such, an aspect of the present disclosure adds, to each partition and cluster, a small logic (e.g., a single bit) in the always-on state, such that when power is gated, the Wrapper Serial Control (WSC) goes through the single-bit path in that always-on domain. As such, even in the lower power mode, the IEEE1500 chain remains intact.

Referring now to FIG. 1, a block diagram of an example computing platform 100 with a test system is depicted in accordance with an embodiment of the present disclosure. FIG. 1 provides a high-level overview of the computing platform 100 and the test system, and the components will be generally described in the context of FIG. 1—more specific details are described with respect to some of the other drawing figures. The computing platform 100 may include an integrated system having a first chip 110 and a second chip 112 that include components such as a processor, a central processing unit (CPU), a graphics processing unit (GPU), a system-on-a-chip (SoC), and/or the like. The first chip 110 may include a JTAG/IEEE 1500 architecture 114 (alternatively referred to herein as "architecture 114") and the second chip 112 may include a JTAG/IEEE 1500 architecture 112 (alternatively referred to herein as "architecture 112") that may be configured consistent with the JTAG/IEEE 1500 standards. The first chip 110 and the second chip 112 may be integrated into the larger computing platform 100, such as a functional computing platform configured to execute operations associated with an autonomous machine (e.g., vehicle, drone, aircraft, water vessel, etc.) or other applications subject to functional-safety standards. The computing platform 100 is a non-limiting example of one type of integrated system, and other embodiments may include fewer chips, more chips, different chips, or a combination thereof, without departing from the scope of the present disclosure.

Generally, the computing platform 100 includes some components on each chip 110 and 112, and for explanatory purposes, these components are labeled in FIG. 1 as being a part of the "on-chip architecture." In addition, the computing platform 100 includes other components that are not necessarily on the chip but that are integrated with the chip as part of the platform 100. These other components are labeled in FIG. 1 as being "off-chip architecture" 102 and both the off-chip components and on-chip components may include hardware and/or software forming part of the test system of the computing platform 100. For example, at a high level, the off-chip and on-chip components of the test system may execute operations to retrieve JTAG test sequences from off-chip external memory 104, and translate the JTAG test sequences into an IEEE 1500 bus 126 to be input into JTAG registers.

As described herein, the JTAG chain shift register can be very long, in the range of hundreds to several thousand bits, and JTAG chain shift registers are on a relatively slow clock at one bit accessed per cycle. In addition, because of the serial nature of the interface, every time a JTAG chain shift register is shifted in or out, the whole chain must be accessed to avoid corrupting the chain. This is true even when a particular BIST includes writing a new value to only a single bit in the JTAG chain shift register. As such in contrast to conventional systems, the test system of the present disclosure includes various software and hardware components that connect the external memory 104 and the IEEE 1500 bus 126 and that reduce the runtime and storage usage associated with JTAG testing.

In one aspect of the disclosure, the first chip 110 and the second chip 112 may include an on-chip in-system-test (IST) master 118 and IST master 120, respectively, that communicates with off-chip components to facilitate in-system testing. For example, as described herein, JTAG test sequences for running BIST, MBIST, and LBIST are stored in the off-chip external memory 104, and these JTAG test sequences may be selectively loaded by an off-chip in-system-test (IST) controller 106 into the on-chip IST masters 118 and 120 when a test is to be performed. In addition, each chip 110 and 112 may include an in-system-test (IST) module 122 including hardware and/or software that receives the JTAG test sequence from the on-chip IST master 120 and translates the JTAG test sequence into the IEEE 1500 bus 126. The IST module 122 is one component of an on-chip test master 124, which includes an access control 125 configured to control access to the IEEE 1500 bus 126 between the IST module 122 and one or more other test modules 127. For example, the other test modules 127 may facilitate other types of system testing, including from ATE 128.

Figure 2:
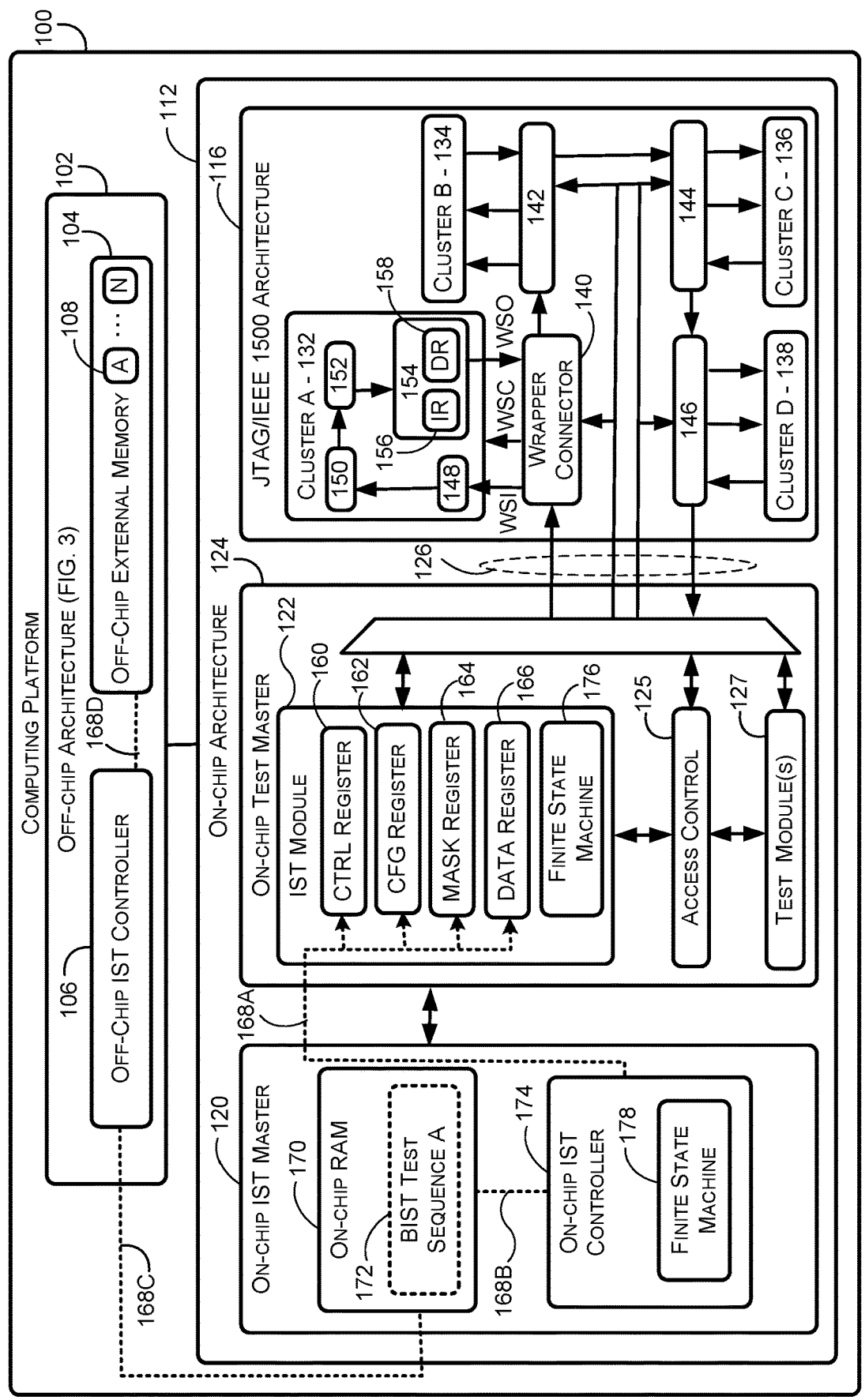
FIG. 2 is a block diagram illustrating additional details of the computing platform depicted in FIG. 1, including additional hardware components of the IST module, additional details of the JTAG/IEEE 1500 architecture, and transmission of a BIST test sequence from the off-chip external memory to the registers of the IST module, in accordance with some embodiments of the present disclosure.

Having provided a high-level overview of some of the components of the platform 100 and the test system, reference is now made to FIG. 2 to describe some components of the test system in more detail. FIG. 2 is another block diagram of a portion of the computing platform 100, including the off-chip architecture 102 and the second chip 112 (alternatively referred to herein as "chip 112"). In addition, the chip 112 may include the architecture 116 that is consistent with the JTAG and IEEE 1500 standards. For example, the architecture 116 may include a series of IEEE 1500 Wrappers/Clusters 132, 134, 136, and 138 (alternatively referred to herein as "clusters 132, 134, 136, and 138") that are daisy chained through wrapper connectors 140, 142, 144, and 146. In addition, each cluster may include a series of daisy chained partitions, as illustrated by the partitions 148, 150, 152, and 154 of the Cluster A 132. Although not illustrated, the clusters 134, 136, and 138 may also include partitions, similar to those of the cluster 132. Each partition may include one or more JTAG registers (e.g., Instruction Register (IR) 156 and Data Register (DR) 158), as well as an IEEE 1500 client (not shown) controlling the registers in that partition. FIG. 2 also depicts a wrapper serial input (WSI), wrapper serial output (WSO), and wrapper serial control (WSC). Each cluster may be associated with a functional unit (logic block) of the chip 112. The wrapper connectors may comprise IEEE 1500 compliant modules (e.g., Wrapper Bypass Registers (WBY), or Wrapper Instruction Registers (WIR)) that can be used to bypass the corresponding cluster connected to a particular wrapper connector. The IEEE 1500 bus 126 provides a path for sending test instructions and test data (e.g., "A" 108) stored in the off-chip external memory 104 to the JTAG registers.

As described herein, the test system of the present disclosure includes various hardware and software that reduce memory usage and runtime associated with running a JTAG testing sequence. In one aspect of the present disclosure, the JTAG registers (e.g., 158), which can be thousands of bits long, are divided into sub-units of bits, and each sub-unit includes a discrete group of bits. For example, the JTAG registers may be divided into DWORDS (32 bits per DWORD) or other sized groups, which may each include a common quantity of bits. In addition, the IST module 122 may include hardware configured to translate JTAG test sequences into the IEEE 1500 interface 126 one bit sub-unit at a time (e.g., one DWORD at a time), which may provide a mechanism (described in more detail herein) by which select bit sub-units can be run without translating the entire JTAG chain test sequence.

In one aspect of the present disclosure, the IST module 122 may include multiple registers that receive different portions of a JTAG test sequence, such as a JTAG sequence that is stored in the off-chip external memory 104 and is selectively retrieved for BIST. As depicted in FIG. 2, the IST module 122 includes a control (CTRL) register 160, a configuration (CFG) register 162, a MASK register 164, and a DATA register 166. In one aspect, each of these registers is a 32-bit register, but other register sizes may be used without departing from the scope of the present disclosure. Generally, the CTRL register 160 and the CFG register 162 are configured to receive portions of the JTAG test sequence (e.g., illustratively depicted by path 168A) including instructions for configuring the JTAG registers (e.g., 156 and 158) for a given BIST. For example, the CTRL register 160 and the CFG register 162 may receive instructions specifying which bit sub-group(s) (e.g. DWORD(s)) is to be written into the IEEE 1500 bus 126. In addition, the MASK register 164 may receive bit-level instructions for programming specific bits within a bit sub-group (e.g., DWORD) specified in the instructions provided to the CTRL register 160 and CFG register 162. The DATA register 166 may be configured to receive the test data to be written into the JTAG chain test sequence (or read the output). Table 1 below provides an example of the types of contents that may be received in the registers when shifting content into the IEEE 1500 bus 126, including the instruction portions for the CTRL register 160 and the CFG register 162 and the test portions for the DATA register.

TABLE 1

| Register | Contents |
| --- | --- |
| CTRL | IR, clusterID, DWORD number least significant bit (lsb), chain length least significant bit (lsb) |
| CFG | DWORD number most significant bit (msb), chain length most significant bit (msb) |
| DATA | Data to be written in the chain |

Using these registers, data may be written into the JTAG chain, or read from the JTAG chain, in various manners. For example, the CTRL register 160 and the CFG register 162 may be configured to trigger a JTAG IR shift to select the target JTAG register chain. Then, for each DWORD, the contents may be written into the DATA register for shifting into the IEEE 1500 bus 126. When reading a sequence from the JTAG chain, the CTRL register 160 and the CFG register 162 may be configured to trigger a JTAG IR shift to select the target JTAG register chain. Then, for each DWORD, the CTRL/CFG registers may be configured with the target DWORD number to shift out the target DWORD value into the DATA register, at which point the DATA register can be read. In some instances, the CTRL register 160 and/or the CFG register 162 may be configured for each DWORD. As such, the IST module 122 may provide a mechanism to access the IEEE 1500 interface (e.g., bus 126) in order to configure JTAG for BIST. In contrast to conventional systems, the registers of the IST module 122 provide the ability to target specific DWORDS within the JTAG registers, and more specifically to target specific bits by using the MASK register, as described in more detail herein.

The test system of the present disclosure may also include on-chip software and hardware that communicate with the off-chip IST controller 106 to receive JTAG test sequences (e.g., A 108) stored in the off-chip external memory 104. In one aspect of the present disclosure, the on-chip IST master 120 includes on-chip IST random access memory (RAM) 170 into which a copy of a test sequence can be loaded. For example, when it is time to run a test, the off-chip IST controller 106 may retrieve the test sequence from the off-chip external memory 104 and load the JTAG test sequence into the on-chip IST RAM 170. In addition, the on-chip IST master 120 may include an on-chip IST controller 174, which may retrieve the test sequence from the on-chip IST RAM 170 and provide the test sequence to the registers of the IST module (e.g., as illustrated by path 168A). In one aspect, the on-chip IST controller may provide the test sequence on a per-DWORD basis, such that after the on-chip IST controller 174 sends a DWORD, it waits until the IST module signals a readiness to receive another DWORD. In one embodiment, one or more software instructions may trigger operations by the on-chip IST controller 174. For example, a software trigger may be written to a software register in the on-chip IST controller 174 after the on-chip RAM 170 is loaded with the test sequence. Once this register is written, a finite state machine (FSM) 178 of the on-chip IST controller 174 may be triggered and may continue executing all the sequences from the on-chip RAM 170 until an end of the operations, such as when an end of the sequence is reached.

FIG. 2 illustratively depicts at least part of a sequence, with a path shown in dashed lines, by which a test sequence is communicated from an off-chip external memory 104. For example, the off-chip IST controller 106 may retrieve the BIST test sequence A 108 from the off-chip external memory 104—as depicted by path 168D—and provide the BIST test sequence A to the on-chip RAM by path 168C. A copy of the BIST test sequence A 172 is depicted in the on-chip RAM 170. Further, the on-chip IST controller may fetch the BIST test sequence A 172 from the on-chip RAM (e.g., according to the path 168B) and provide it on a per-DWORD basis to the IST module 122, as depicted by the path 168A. As described herein, the IST module translates the DWORD(s) into the IEEE 1500 bus 126 for input to the JTAG register(s).

In some embodiments, the hardware and software of the test system described with respect to FIGS. 1 and 2 may be leveraged in different ways to improve runtime and memory utilization when running BIST. As described herein, in conventional systems, when a JTAG register is shifted in/out, the whole chain needs to be accessed, otherwise the chain may become corrupted. For example, even if the BIST includes programming a single bit in a chain, the whole chain may need to be shifted to avoid corruption. However, storing the entire contents of all the chains, as is typically done in conventional systems, may utilize a significant amount of storage (e.g., millions of bits). For example, if a JTAG chain is one hundred DWORDS long, even if only two DWORDS need to be written for BIST, the number of bits needed for storage of the content identified in Table 1 (above) is 3264 bits (e.g., 32 bits for CTRL Register 160, 32 bits for CFG register 62, and 3200 bits for DATA register 166). In addition, in order to read data out of the IEEE 1500 bus 126, 6400 bits are needed for storage (e.g., 32 bits for CTRL register for each DWORD in the JTAG chain and 32 bits for CFG register 162 for each DWORD in the JTAG chain), since the CTRL register 160 and the CFG register 162 may be configured separately for each DWORD. In contrast to conventional systems, the system of the present disclosure only stores target DWORDS that need to be written to execute a given BIST, in combination with instructions for configuring the CTRL register 160 and the CFG Register 162. As such, the system of the present disclosure leverages a predefined reset value of each bit in the JTAG chain shift register and uses the organization of the JTAG chain shift register into sub-sets of bits (e.g., DWORDS) to target specific bits and skip non-target bits.

More specifically, when configuring the CTRL register 160 and the CFG register 162 to execute BIST, the test system of the present disclosure may include a "burst_mode" instruction, which may cause existing values shifted out of the WSO to be looped back to WSI to retain the existing value (e.g., predefined reset value). As such, a burst-write sequence into a JTAG chain may be executed by initially configuring the CTRL register 160 and the CFG register 162 to select burst_write mode, in addition to configuring the chain which performs the IR shift. Then, as described herein, for the target DWORD, the CTRL register 160 and the CFG register 162 may be configured to program a target DWORD (see e.g., Table 1, above), and the DATA register 166 may be programmed with the contents of the DWORD to be shifted into the IEEE 1500 bus 126. Using the burst_mode instruction, in combination with the registers in the IST module 122, the test system of the present disclosure significantly reduces memory utilization, since none of the non-target DWORDS in a given BIST are stored. For example, if a JTAG chain is 100 DWORDS and if only two DWORDS are written to execute BIST, then 192 bits are needed for storage (e.g. 32 bits for CTRL register 160 for first DWORD, 32 bits for CFG register 162 for first DWORD, 32 bits for DATA register 166 of first DWORD, 32 bits for CTRL register 160 for second DWORD, 32 bits for CFG register 162 for second DWORD, and 32 bits for DATA register 166 of second DWORD).

In another aspect of the present disclosure, in addition to providing the ability to program at the DWORD level, the test system may use the MASK register 164 to program each bit within a DWORD. That is, if only certain bits in a DWORD need to be overwritten for the BIST, then the MASK Register 164 may be programmed to only modify those select bits, and retain the other bits at their predefined reset value. As used in this disclosure, this may be referred to as a "skip-bit instruction," which identifies single bits in a given DWORD that can retain predefined reset value. If all bits in a DWORD are to be programmed for a BIST, then the MASK Register 164 can be skipped. As such, the sequence described above for configuring burst_mode may include one or more additional operations related to the MASK register 164. More specifically, after the CTRL register 160 and the CFG register 162 are configured to program a target DWORD (see e.g., Table 1), the MASK register may be programmed with selective bits in the target DWORD. However, this can be skipped if all bits in a DWORD will be programmed. The DATA register 166 may then be programmed with the contents of the DWORD being shifted into the IEEE 1500 bus 126. As such, the MASK register 164 provides for additional storage savings at the bit level.

In another aspect of the present disclosure, the amount of overhead needed to configure multiple DWORDS through the CTRL register 160 and the CFG Register 162 is reduced when a given BIST requires programming consecutive DWORDS (e.g., directly adjacent to one another in the chain). That is, as described herein, in some instances the CTRL register 160 and the CFG registers 162 may be configured for each DWORD, and when both registers are 32 bit, this requires 64 bits of storage for each DWORD. In some instances, when consecutive DWORDS are programmed in order to execute BIST, an "auto-increment DWORD" instruction can be configured in the BIST and provided to the CTRL register 160 and the CFG registers 162. This instruction may program the IST module 122 to automatically translate subsequent DWORDS and skip the CTRL register 160 and the CFG Register 162 writes for the subsequent DWORDS. This approach can be combined with the burst_mode and MASK Register 164 to provide combined reductions in memory requirements and runtime for running a given BIST. For example, if a JTAG chain is one hundred DWORDS and if only two consecutive DWORDS are written to execute BIST, then 128 bits are needed for storage using burst_mode and auto-increment (e.g., 32 bits for CTRL register 160 for a first and second DWORD, 32 bits for CFG register 162 for the first and second DWORD, and 64 bits for DATA register 166 for the first and second DWORD). The burst_mode and auto-increment modes also provide significant storage savings for reading a JTAG chain. For example, as described above, to read a chain of one hundred DWORDS using conventional systems, 6400 bits of storage are used. In contrast, using burst_write and auto-increment modes for reading a JTAG chain, the storage requirements to store the read instructions of a one hundred DWORD chain is 64 bits, since the CTRL register 160 and the CFG register 162 may not have to be re-configured for each DWORD (e.g., 32 bits for the CTRL register 160 and 32 bits for the CFG register 162). In such an example, storage size for reading a one hundred DWORD JTAG chain is reduced from 6400 bits to 64 bits.

Figure 3:
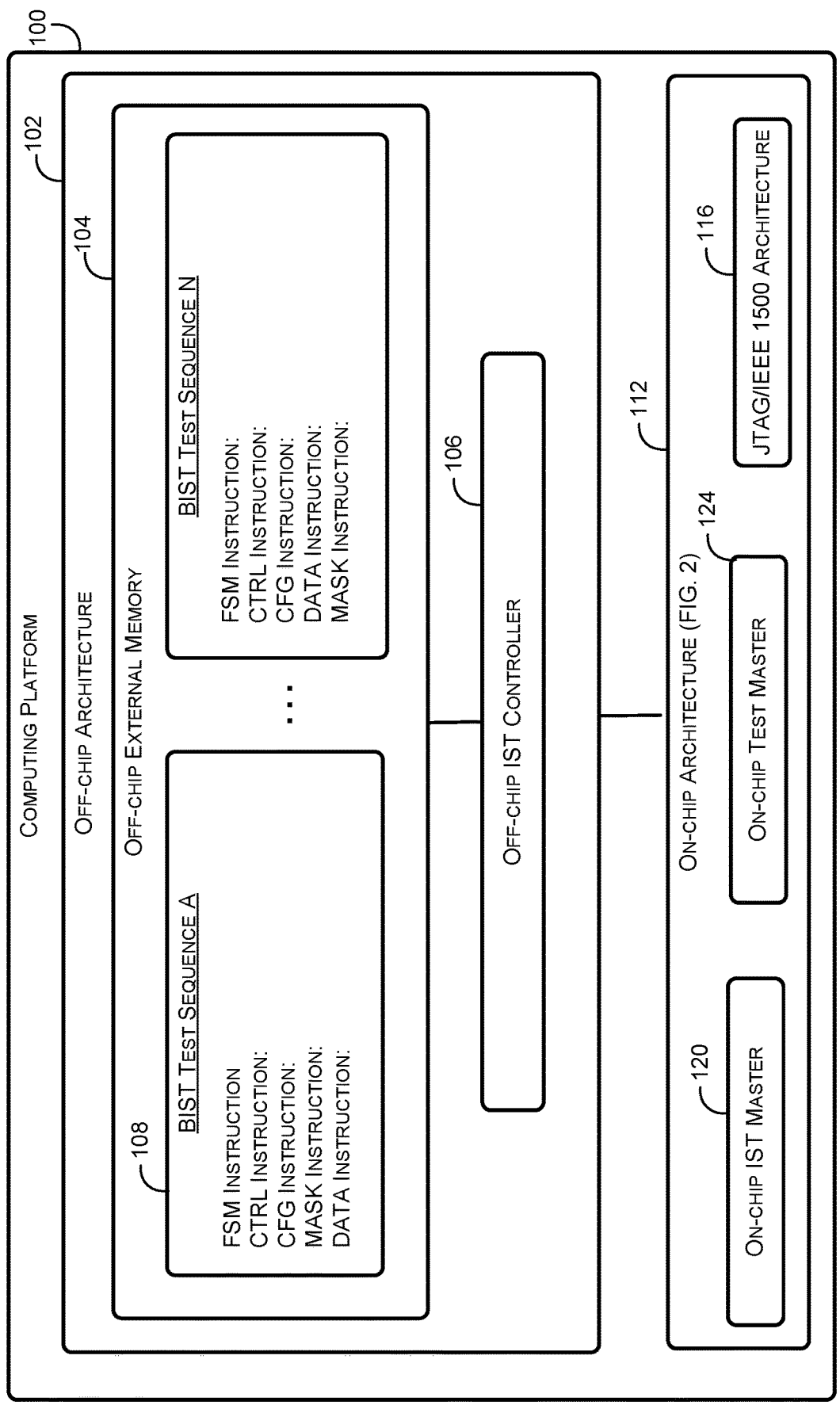
FIG. 3 is a block diagram illustrating additional details of the computing platform depicted in FIG. 1, including additional details of BIST test sequences that may be stored in the off-chip external memory, in accordance with some embodiments of the present disclosure.

Once the computing platform 100 is manufactured to include the hardware described above, including the JTAG/IEEE 1500 architecture and the test system, BIST can be configured using ATE. In addition, with the ability to program only target DWORDS for a given BIST, the size of the resulting BIST test sequence can be significantly reduced. Once configured, these BIST test sequences can be stored separately in the off-chip external memory 104, such that the off-chip IST controller 106 can selectively retrieve a select BIST test sequence. For example, referring to FIG. 3, a block diagram showing more detailed view of the off-chip architecture 102 is depicted. FIG. 3 includes the off-chip external memory 104, which may store BIST test sequences. The BIST test sequences may include BIST test sequence A 108, which may include both an instruction portion (e.g., FSM instruction, CTRL instruction, CFG instruction, and MASK instruction) and a test-data portion (e.g., DATA instruction). In some instances, a test sequence (e.g., BIST test sequence A 108) may have an instruction portion and a data portion related to a single JTAG register. In other aspects, a test sequence (e.g., BIST test sequence A 108) may have an instruction portion and a data portion related to multiple JTAG registers, such that there may be multiple FSM instructions, CTRL instructions, CFG instructions, MASK instructions, and DATA instructions within a single test sequence. When triggered to retrieve the BIST test sequence A 108, the off-chip IST controller 106 (e.g., secured software) may retrieve the BIST test sequence A 108 from the memory 104 and communicate the BIST test sequence A 108 to the on-chip architecture 112. For example, the BIST test sequence A 108 may be loaded into the on-chip RAM as described above. The BIST test sequence A 108 can then be used to configure the registers and run BIST on a target portion of the JTAG/IEEE 1500 architecture 116. As such, in contrast to conventional systems that shift the entire chain and specify a deterministic value for all bits on the chain, the test system of the present disclosure permits any target BIST instance or target JTAG registers to be selectively programmed with the discrete BIST test sequences (e.g., 108), while preserving the existing value of all the other registers on the same chain.

As mentioned herein, conventional systems do not capture the functional values of clocks, power, and I/O states. For example, conventional approaches permit overriding the functional values using designated JTAG registers (e.g., 158 in FIG. 2), but these conventional approaches are not aware of the already configured functional settings and thus are not able to subsequently maintain or restore the functional settings. In contrast, prior to running LBIST, the system of the present disclosure captures and holds the functional settings for configuring clocks, power, and I/O to avoid corrupting these states during LBIST scan operations. More specifically, the present disclosure includes software that programs JTAG registers to capture the functional settings prior to running the LBIST scan operation, and in contrast to conventional test systems, the functional settings can be read after LBIST.

Figure 4:
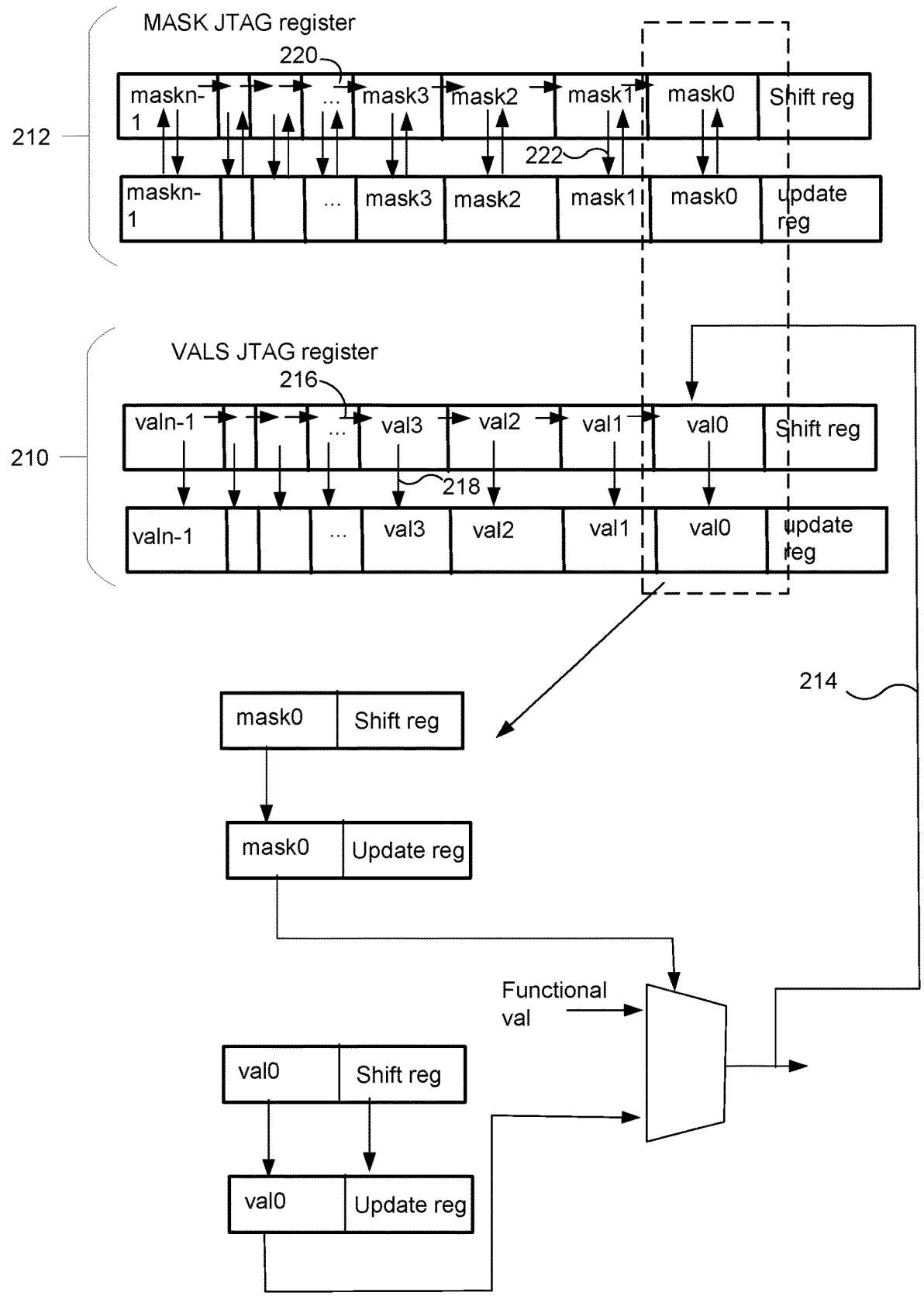
FIG. 4 illustrates data shifting through JTAG registers when functional states are captured, in accordance with some embodiments of the present disclosure.

More specifically, referring to FIG. 4, an example JTAG register is provided, such as, without limitation, the JTAG register 158 in FIG. 2. The system of the present disclosure may include software that programs a VALS JTAG register 210 and a MASK JTAG register 212 to capture the functional settings prior to running the LBIST scan operation, such that the functional settings can be read and restored after the test. Some of these operations depicted in FIG. 4 relate specifically to a finite state machine (e.g., finite state machine (FSM) 176 of the IST module 122) having various states consistent with the JTAG standard. Prior to overriding the functional data, during the "captureDR" step, the functional values may be written into the VALS JTAG register 210, as depicted by path 214. Then during the "shiftDR" stage the entire chain may be shifted through the VALS JTAG register 210, as depicted by arrows 216. Finally, during the "updateDR" step, the functional values in the shift register may be captured into the update latch of the VALS JTAG register 210, as indicated by arrow 218. At this point, the override data can be shifted into the VALS JTAG register 210 in a conventional manner. For example, the MASK JTAG register 212 may initially set all values to "0" while the VALS JTAG register 210 is programmed. After the VALS JTAG register 210 is programmed, all bits in the chain of the MASK JTAG register 212 may be set to "1." For instance, during "shiftDR" 220 the entire chain is shifted to set to "1," and during "updateDR" 222 the value captured in the shift register is captured into the update latch. In this aspect of the present disclosure, the capture path into the VALS JTAG register 210, which is unused in conventional systems, may be utilized to capture the functional states of the clocks, power, and I/O, so that the functional values are not corrupted during LBIST.

In a further aspect, the present disclosure also includes operations for optimizing the capture of functional values by reducing the capture/hold time of the cycles. More specifically, captureDR 214 and updateDR 218 may include single cycle operations and shiftDR 216 may include a multi-cycle operation depending on the length of the target JTAG chain. For example, if the target JTAG chain is 1000 bits, the time required to execute the captureDR 214, shiftDR 216, and updateDR 218 operations mentioned above is 1002 (e.g., 1 cycle for captureDR 214, 1000 cycles for shiftDR 216, and 1 cycle for updateDR 218). However, the shiftDR operation (e.g., path 216 in FIG. 4) may not actually be required in order to capture the functional configuration into the VALS JTAG register 210. But as mentioned above, conventional systems do not provide the ability to skip steps in the FSM, which causes unnecessary cycles (e.g., 1000 unnecessary cycles based on the example of a JTAG chain with 1000 bits). In contrast to conventional systems, the present disclosure provides the ability to skip the shiftDR 216 state entirely by programming a bit in the CFG Register 162, which allows the system to omit the cycles that would otherwise be required in the shiftDR 216 state. This is another example of how the hardware (e.g., CFG register 162) described in FIGS. 1 and 2 is leveraged to improve runtime associated with BIST.

In a further aspect of the present disclosure, when running BIST, some of the settings in a JTAG register capture functional settings, while other fields are programmed with new values. This may apply for certain JTAG registers having some fields used to capture functional settings and other fields used to configure settings for MBIST or LBIST. As such, the various aspects described herein, such as burst_mode, auto-increment, MASK Register, and capturing functional values can be combined to selectively program a few bits while capturing the functional settings of the other bits.

Referring back to FIG. 2, the chip 112 may have multiple JTAG registers replicated across partitions or replicated across clusters, such that for some BIST, these JTAG registers may need to be programmed with the same data. For example, the architecture 116 may include 300 partitions that should each receive an MBIST JTAG chain of 200 bits. Conventional test systems may execute more than 60,000 cycles to program the data into the daisy-chained JTAG registers in all the partitions and may require all such data to be stored on-chip for every partition. These conventional approaches may increase both storage and runtime requirements on the system.

In contrast to these conventional systems, the test system of the present disclosure may configure a JTAG register in each partition and in each cluster to enable either a broadcast mode—for distributing a JTAG test sequence—or a daisy-chain mode. In broadcast mode, all partitions in a cluster can be broadcasted and all clusters in a chip can be broadcasted. For example, the instructions that are stored as part of the BIST test sequence (e.g., A 108) may include an instruction to activate a broadcast mode, which is controlled by the partition-level or cluster-level JTAG register organized among the architecture 116. As such, when the broadcast mode is activated by way of the JTAG register receiving the broadcast-mode instruction, all of the partitions (or clusters) can be programmed in parallel with the same BIST test sequence. As such, using broadcast mode, runtime and storage utilization can be reduced significantly. Referring back to the example outlined above (e.g., 300 partitions and BIST JTAG chain of 200 bits), instead of programming a replicated JTAG chain with 60,000 cycles using conventional systems, the broadcast mode of the present disclosure uses just a few hundred shift cycles, since the partitions can be programmed in parallel. In addition, the entire daisy chain contents are not required to be stored on the chip. Instead, it may be sufficient to store just the per partition couple of hundred bits, retrieve the bits once, and broadcast the bits into all the partitions.

In some instances, to utilize broadcast mode, the chain length and the contents to be programmed may need to be the same across the partitions/clusters. Also, the entire chain may need to be programmed if there are hurdles to programming selective bits while retaining the other fields. For example, referring back to FIG. 4 describing capture of functional values, test scenarios may arise in which MASK JTAG registers (e.g., 212) in different partitions are different lengths. As explained above, each bit of the MASK JTAG Register may be changed to "1," (e.g., during shiftDR 220) and as such, over-shifting will still effectively program the MASK JTAG Register to the required "1" value (under-shifting would not and would leave the "0" value in some of the bits). Therefore, in the system of the present disclosure, the maximum chain length among all target petitions receiving data via a broadcast is used to determine how many "1" values to shift into the MASK JTAG Register. For example, a first partition may include a first MASK JTAG Register having a first quantity of bits (e.g., 120), and a second partition may include a second MASK JTAG Register having a second quantity of bits (e.g., 110), which may be less than the first quantity of bits. If a test sequence was broadcasted to the first and second partition, then a quantity of "1 s" equal to the first quantity (e.g., 120) may be shifted into the second MASK JTAG Register to capture the functional values.

With continued reference to FIG. 2, the architecture 116 may include one or more SKUs, and some partitions or clusters on the JTAG daisy-chain path may be power gated. In that case, the chain could potentially get blocked and prevent access to the non-power gated partitions or clusters. In other words, if a partition or cluster is power gated, then it could break the scan path going through it. As such, an aspect of the present disclosure uses the IEEE 1500 WS_BYPASS path to reduce the likelihood that the chain will be blocked. More specifically, a small logic is kept in the always-on domain for every partition and cluster such that when power is gated, WSC goes through the single-bit WS_BYPASS path in that always-on domain. As such, even in the lower power mode, the IEEE 1500 chain remains intact.

Furthermore, the JTAG test sequence may be configured to access one cluster or one partition at a time, while bypassing the other clusters or partitions through the single-bit bypass path that is on the non-gated power domain. In other words, even though one cluster or one partition is accessed at a time, the JTAG test sequence may be configured to include instructions and data for all the clusters or partitions because the hardware must support all SKUs—but the on-chip IST controller 174 may load test sequences on a per-cluster or per-partition basis. For example, after a JTAG sequence for a partition or cluster is loaded into the IEEE 1500 bus 126, the finite state machine may transition from shiftDR to shiftIR to permit the next partition or cluster to be loaded separately. Even if a cluster or partition is rail-gated, the sequence targeting that cluster or partition may still be executed, and real programming for that cluster may fail. However, this may not trigger a fault because the rail-gated cluster is not used functionally and doesn't need to be tested by the test system.

Having described various aspects of the present disclosure with respect to FIGS. 1-4, various additional aspects will now be described. When describing these various additional aspects, reference may also be made back to FIGS. 1-4 for illustrative purposes. More specifically, another aspect of the present disclosure includes a test system for performing BIST. The test system may include a test-sequence register (e.g., JTAG register 158) including a plurality of bit subsets (e.g., DWORDS having 32 bits or bit subsets having another quantity of bits) and forming a path (e.g., serial or daisy-chain) configured to receive a serial input of a test sequence. In addition, the test system may include an instruction register (e.g., 156) to control transmission of the serial input into the test-sequence register. The test system may also include a control register (e.g., 160) to program the instruction register by receiving a first set of data (e.g., content of CTRL register identified in Table 1 above) including a first subset identifier (e.g., DWORD id lsb) of a bit subset in the plurality of bit subsets. The test system may include a configuration register (e.g., 162) to program the instruction register by receiving and communicating a second set of data including a second subset identifier (e.g., DWORD id msb) of the bit subset. Furthermore, the test system may include a data register (e.g., 166) to receive the test sequence (e.g., DATA instruction in BIST test sequence) to be written into the serial input.

The test system may include other additional or alternative components. For example, the test system may also include another register (e.g., 164) to program the instruction register (e.g., 156) by receiving a skip-bit instruction that specifies one or more bits of the bit subset to retain a predefined reset value. In other aspects of the test system, a burst_mode instruction may be provided to the CTRL register and/or the CFG register, and the burst_mode instruction may program the instruction register to loop bits back into the path (e.g., WSC path) as a serial input (e.g., where the bits are in the test-sequence register (e.g., 158) when the test sequence is transferred into the path and are not in the bit subset). In another aspect of the test system, an auto-increment instruction may be provided to the CTRL register and/or the CFG register, and the auto-increment instruction may program the instruction register to control a serial input of another bit subset in a same manner as the bit subset (e.g., where the other bit subset follows consecutively after the bit subset in the test sequence).

In other aspects of the test system, the test-sequence register (e.g., JTAG register) may be configured to serially output test results that are shifted into the data register (e.g., 166) to be read. In still another aspect, the test system may further include an access-control application (e.g., access control 125) configured to control access to the test-sequence register (e.g., JTAG register) between the data register (e.g., 166) and external automatic test equipment (e.g., 128). In some embodiments, the test-sequence register may be disposed on a chip (e.g., 112), and the test system may further include a test-sequence-retrieval application (e.g., on-chip IST controller 174) on the chip and configured to retrieve the test sequence (e.g., 172) from on-chip memory (e.g., 170). In addition, the test system may include a test-sequence-retrieval application (e.g., off-chip IST controller 106) maintained off the chip and configured to retrieve the test sequence (e.g., 108) from off-chip external memory (e.g., 104) and load the test sequence into on-chip memory (e.g., 170).

In the test system, the test sequence may include a functional-value-restore instruction that, when run in the JTAG register, captures functional values of a clock, a power source, and I/O prior to running LBIST. For example, during a captureDR operation of a finite state machine (FSM), which controls access to the path (e.g., WSC path), the functional values may be captured (e.g., 214 in FIG. 4) in a data chain in a VALS JTAG register (e.g., 210). In addition, during a shiftDR stage of the FSM, the data chain in the VALS JTAG register may be shifted (e.g., 216 in FIG. 4). Furthermore, during an updateDR operation, the functional values may be captured in an update latch of the VALS JTAG register (e.g., 218). After the VALS JTAG register is programmed, all bits in a MASK JTAG register may be set to a common value (e.g., "1").

In the test system, the test-sequence register may be a first test-sequence register. The system may also include a first chip partition including the first test-sequence register and a second chip partition daisy chained with the first chip partition and including a second test-sequence register (e.g., second JTAG register). The first test-sequence register and the second test-sequence register may both be configured to receive a broadcast input of the test sequence for running logic built-in self-test (LBIST), such as where the first and second test-sequence registers are duplicates. The first chip partition and the second chip partition may each include a respective MASK JTAG register (e.g., 212) having bits that are all changed to a common value prior to running the LBIST when functional values of clocks, power, and I/O states are captured. When a first MASK JTAG register of the first partition has a first quantity of bits that is larger than a second quantity of bits of a second MASK JTAG register of the second partition, then the broadcast input provided to both the first chip partition and the second chip partition may include a quantity of common values equal to the first quantity.

Figure 5:
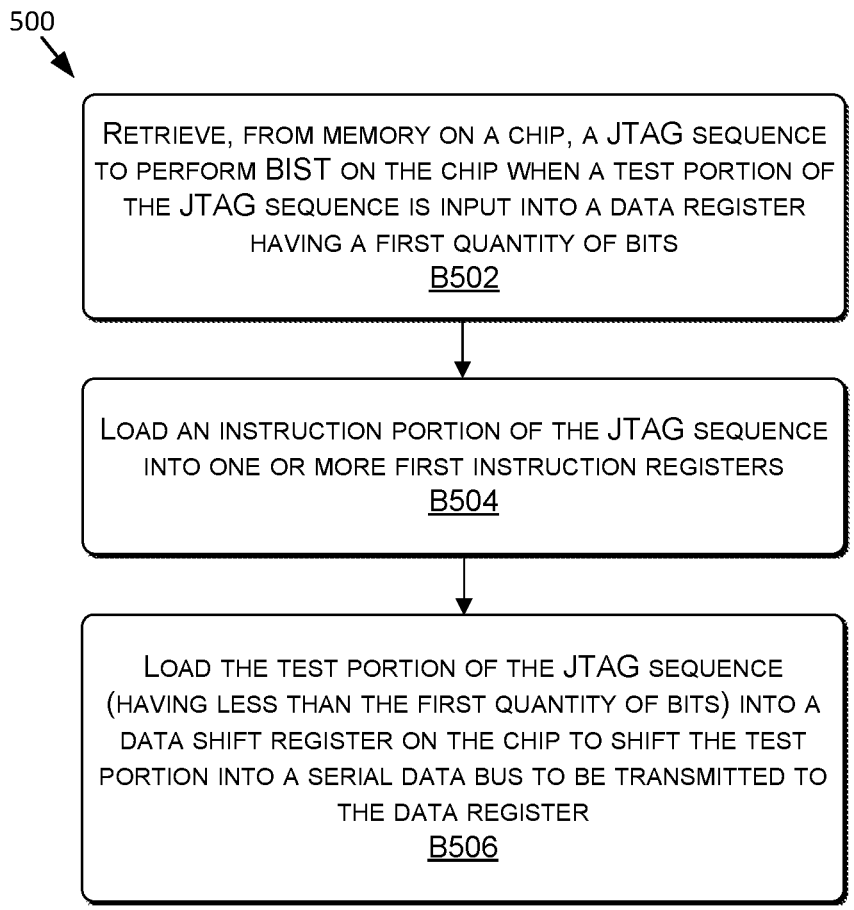
FIG. 5 is a flow diagram showing a method of performing BIST, in accordance with some embodiments of the present disclosure.
Figure 6:
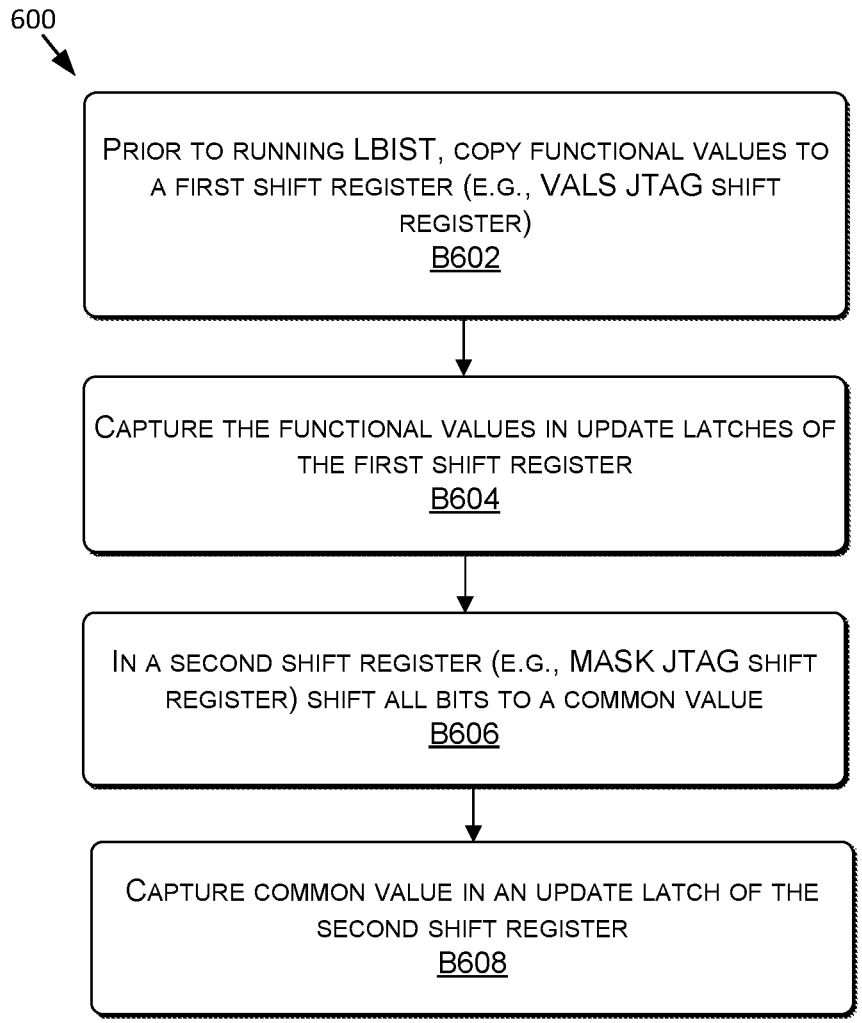
FIG. 6 is a flow diagram showing a method of performing BIST, in accordance with some embodiments of the present disclosure.

Now referring to FIGS. 5 and 6, each block of methods 500 and 600, described herein, comprises a computing process that may be performed using any combination of hardware, firmware, and/or software. For instance, various functions may be carried out by a processor executing instructions stored in memory. The methods 500 and 600 may also be embodied as computer-usable instructions stored on computer storage media. The methods 500 and 600 may be provided by a standalone application, a service or hosted service (standalone or in combination with another hosted service), or a plug-in to another product, to name a few. In addition, methods 500 and 600 are described, by way of example, with respect to the system 100 of FIGS. 1-3. However, these methods may additionally or alternatively be executed by any one system, or any combination of systems, including, but not limited to, those described herein.

Now referring to FIG. 5, FIG. 5 is a flow diagram showing a method 500 for running BIST, in accordance with some embodiments of the present disclosure. The method 500, at block B502, includes retrieving, from memory on a chip, a JTAG sequence to perform a built-in self-test (BIST) on the chip when a test portion of the JTAG sequence is input into a data register (e.g., JTAG register) having a first quantity of bits.

The method 500, at block B504, includes loading an instruction portion of the JTAG sequence into one or more first instruction registers (e.g., 160, 162, etc.). The first instruction registers may program a second instruction register (e.g., 156) controlling the data register. An example of a JTAG sequence is the BIST test sequence A 172, which may be retrieved by the on-chip IST controller and loaded into the registers of the IST module 122. The JTAG sequence may include a test-data portion for performing the BIST when the test-data portion is translated into the IEEE 1500 bus 126 and input into the JTAG data register (e.g., 158). The JTAG data register includes a first quantity of bits. In addition, the BIST test sequence A 172 also includes an instruction portion that is loaded into the CTRL register 160 and the CFG register 162 for programming a JTAG instruction register (e.g., 156), which may control the JTAG data register 158.

The method 500, at block B506, includes loading the test portion of the JTAG sequence into a data shift register (e.g., 166) on the chip to shift the test portion into a serial data bus to be transmitted to the data register. The test portion of the JTAG sequence may include a second quantity of bits (e.g., DWORD), which may be less than the first quantity of bits (e.g., since the DWORD is a bit subset of the JTAG chain). In this respect, only a portion of the JTAG chain may be written, thereby reducing runtime and memory utilization.

Referring now to FIG. 6, FIG. 6 includes another flow diagram showing a method 600 for running BIST, in accordance with some embodiments of the present disclosure. The method 600, at block B602, includes, prior to running a logic built-in self-test (LBIST) on a chip, copying functional values of at least one of a clock, power source, or I/O states to a first shift register (e.g., a VALS JTAG register 212). For example, during a captureDR operation, functional values of a clock, power source, and I/O state(s) may be copied to a shift register. The capture DR state may correspond to a state of a finite state machine (FSM), and the FSM may include a first shiftDR state after the captureDR state. For example, in FIG. 4, reference numeral 214 may represent functional values being copied into the VALS JTAG register 210.

The method 600, at block B604, includes capturing the functional values in update latches of the first shift register. For example, the functional values may be captured in update latches of the VALS JTAG shift register 210 during a first updateDR operation (e.g., 218 in FIG. 4).

The method 600, at block B606, includes, in a second shift register (e.g., MASK JTAG register), shifting all bits to a common value. For example, during a second shiftDR operation (e.g., arrow 220), the respective value of all the bits in the MASK JTAG register 212 may be shifted to a same value that controls an operation of the VALS JTAG register 210. For example, by shifting all values to "1" in the MASK JTAG register 212, the VALS JTAG register 210 can be programmed with override data.

The method 600, at block B608, includes capturing the common value in an update latch of the second shift register. For example, each of the common values is captured in an update latch of the MASK JTAG register 212 during a second updateDR operation (e.g., arrow 222 in FIG. 4), where shifting all bits to a common value may enable the functional values to be overridden with override data shifted into the VALS JTAG register 210.

The disclosure may be described in the general context of computer code or machine-useable instructions, including computer-executable instructions such as program modules, being executed by a computer or other machine, such as a personal data assistant or other handheld device. Generally, program modules including routines, programs, objects, components, data structures, etc., refer to code that perform particular tasks or implement particular abstract data types. The disclosure may be practiced in a variety of system configurations, including handheld devices, consumer electronics, general-purpose computers, more specialty computing devices, etc. The disclosure may also be practiced in distributed computing environments where tasks are performed by remote-processing devices that are linked through a communications network.

As used herein, a recitation of "and/or" with respect to two or more elements should be interpreted to mean only one element, or a combination of elements. For example, "element A, element B, and/or element C" may include only element A, only element B, only element C, element A and element B, element A and element C, element B and element C, or elements A, B, and C. In addition, "at least one of element A or element B" may include at least one of element A, at least one of element B, or at least one of element A and at least one of element B. Further, "at least one of element A and element B" may include at least one of element A, at least one of element B, or at least one of element A and at least one of element B.

The subject matter of the present disclosure is described with specificity herein to meet statutory requirements. However, the description itself is not intended to limit the scope of this disclosure. Rather, the inventors have contemplated that the claimed subject matter may also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

What is claimed is:

1. A test system comprising:
    a test-sequence register including a plurality of bit subsets and forming a path to receive a serial input of a test sequence;
    an instruction register to control transmission of the serial input into the test-sequence register;
    a control register to program the instruction register by receiving a first set of data including a first subset identifier of a bit subset in the plurality of bit subsets;
    a configuration register to program the instruction register by receiving and communicating a second set of data including a second subset identifier of the bit subset; and
    a data register to receive the test sequence to be written into the serial input.

2. The test system of claim 1, further comprising another register to program the test-sequence register by receiving a skip-bit instruction that specifies one or more bits of the bit subset to retain a predefined reset value.

3. The test system of claim 1, wherein the first set of data, the second set of data, or both the first set of data and the second set of data include a burst-mode instruction, the burst-mode instruction programming the instruction register to loop bits back into the path as a serial input, wherein the bits are in the test-sequence register when the test sequence is transferred into the scan path and are not in the bit subset.

4. The test system of claim 1, wherein the first set of data, the second set of data, or both the first set of data and the second set of data include an auto-increment instruction, the auto-increment instruction programming the instruction register to control a serial input of another bit subset in a same manner as the bit subset, and wherein the other bit subset follows consecutively after the bit subset in the test sequence.

5. The test system of claim 1, wherein the test-sequence register is configured to serially output test results that are shifted into the data register.

6. The test system of claim 1, further comprising an access-control application configured to control access to the test-sequence register between the data register and external automatic test equipment.

7. The test system of claim 1, wherein the test-sequence register is on a chip, and wherein the test system further comprises a test-sequence-retrieval application on the chip and configured to retrieve the test sequence from on-chip memory.

8. The test system of claim 1, wherein the test-sequence register is on a chip, and wherein the test system further comprises a test-sequence-retrieval application maintained off the chip and configured to retrieve the test sequence from off-chip external memory and load the test sequence into on-chip memory.

9. The test system of claim 1, wherein the test sequence includes a functional-value-restore instruction configured to, prior to running a logic built-in self-test (LBIST), capture functional values of a clock, a power source, and I/O by:
    during a captureDR step of a finite state machine (FSM), which controls access to the scan path, capturing the functional values a data chain in a VALS JTAG Register;
    during a shiftDR stage of the FSM, shifting the data chain in the VALS JTAG Register;
    during an updateDR step, capturing the functional values in an update latch of the VALS JTAG Register; and
    after the VALS JTAG Register is programmed, setting all bits in a MASK JTAG Register to a common value.

10. The test system of claim 1, wherein the test-sequence register is a first test-sequence register, and the system further comprises:
    a first chip partition including the first test-sequence register; and
    a second chip partition daisy chained with the first chip partition and including a second test-sequence register, wherein:
        the first test-sequence register and the second test-sequence register are both configured to receive a broadcast input of the test sequence for running logic built-in self-test (LBIST);
        the first chip partition and the second chip partition each include a respective MASK Register having bits that are all changed to a common value prior to running the LBIST when functional values of clocks, power, and I/O states are captured;
        a first MASK register of the first partition has a first quantity of bits that is larger than a second quantity of bits of a second Mask register of the second partition; and
        the broadcast input provided to both the first chip partition and the second chip partition includes a quantity of common values equal to the first quantity.

11. The test system of claim 1, further comprising a JTAG register that is configurable in either broadcast mode or daisy-chain mode by a user-defined instruction in the test sequence.

12. The test system of claim 1, wherein the test-sequence register is configured consistent with IEEE 1500, and wherein the test system further comprises a small logic in the always-on domain for each partition.

13. A method comprising:
    retrieving, from memory on a chip, a JTAG sequence to perform a built-in self-test (BIST) on the chip when a test portion of the JTAG sequence is input into a data register having a first quantity of bits;
    loading an instruction portion of the JTAG sequence into one or more first instruction registers that program a second instruction register controlling the data register; and
    loading the test portion of the JTAG sequence into a data shift register on the chip to shift the test portion into a serial data bus to be transmitted to the data register, the test portion of the JTAG sequence including a second quantity of bits less than the first quantity of bits.

14. The method of claim 13, wherein the instruction portion includes a burst-mode instruction that programs the second instruction register to retain non-target bits in the first quantity of bits in a predefined value by shifting the predefined value back into the data register when the test portion is input to the data register.

15. The method of claim 13, further comprising retaining one or more bits included among the test portion to a predefined value before shifting into the serial data bus.

16. The method of claim 13, wherein the instruction portion includes an auto-increment instruction that programs the instruction register to apply a same set of controls to another test portion of the JTAG sequence.

17. The method of claim 13, wherein the one or more first instruction registers comprises one or more BIST instruction registers, and the second instruction register comprises a JTAG instruction register.

18. A method comprising:
prior to running a logic built-in self-test (LBIST) on a chip, copying functional values of at least one of a clock, power source, or I/O state to a first shift register during a capture state of a finite state machine (FSM), the FSM including a first shift state after the capture state;
capturing the functional values in update latches of the first shift register during a first update state;
in a second shift register, shifting all bits to a respective value during a second shift state, the respective value of all the bits in the second shift register being shifted to a same value that controls an operation of the first shift register; and
capturing each of the respective values in an update latch of the second shift register during a second update state, wherein shifting all bits to a common value enables the functional values to be overridden with override data shifted into the first shift register.

19. The method of claim 18, wherein the first shift register comprises a VALS JTAG shift register and the second shift register comprises a MASK JTAG shift register.

20. The method of claim 18, further comprising skipping the first shift state without executing any cycles by programming an instruction into a BIST instruction register that controls the FSM.

21. The method of claim 18, further comprising, broadcasting a JTAG test sequence for running the LBIST to both a first chip partition and a second chip partition by configuring a user-defined JTAG register that is configurable in broadcast mode or daisy-chain mode.

22. The method of claim 18, further comprising,
broadcasting a JTAG test sequence for running the LBIST to both a first chip partition including the first shift register and the second shift register and a second chip partition including a third shift register corresponding to the second shift register, wherein the third shift register includes a first quantity of bits that is larger than a second quantity of bits in the second shift register; and
shifting a number of bits into the second shift register equal to the quantity of bits of the third shift register.

* * * * *